US010552047B2

(12) United States Patent
Nosaka et al.

(10) Patent No.: US 10,552,047 B2
(45) Date of Patent: Feb. 4, 2020

(54) MEMORY SYSTEM

(71) Applicant: Toshiba Memory Corporation, Tokyo (JP)

(72) Inventors: Yuusuke Nosaka, Inagi Tokyo (JP); Masanobu Shirakawa, Chigasaki Kanagawa (JP); Yoshihisa Kojima, Kawasaki Kanagawa (JP); Kiyotaka Iwasaki, Yokohama Kanagawa (JP); Hiroshi Sukegawa, Nerima Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 367 days.

(21) Appl. No.: 14/843,931

(22) Filed: Sep. 2, 2015

(65) Prior Publication Data
US 2016/0246514 A1 Aug. 25, 2016

Related U.S. Application Data

(60) Provisional application No. 62/119,733, filed on Feb. 23, 2015.

(51) Int. Cl.
*G06F 3/06* (2006.01)

(52) U.S. Cl.
CPC .......... *G06F 3/0611* (2013.01); *G06F 3/0659* (2013.01); *G06F 3/0679* (2013.01)

(58) Field of Classification Search
CPC .... G06F 3/0659; G06F 3/0611; G06F 3/0679; G11C 7/1042; G11C 7/1063; G11C 16/0483
See application file for complete search history.

(56) References Cited

U.S. PATENT DOCUMENTS 7,023,741 B2 * 4/2006 Nakamura ............. G11C 7/065
  365/189.04
7,843,758 B2 * 11/2010 Byeon ................. G06F 13/1684
  365/185.11

(Continued)

FOREIGN PATENT DOCUMENTS

CN         1797603 A    7/2006
CN       101226765 A    7/2008
(Continued)

*Primary Examiner* — Tim T Vo
*Assistant Examiner* — Harry Z Wang
(74) *Attorney, Agent, or Firm* — Kim & Stewart LLP

(57) ABSTRACT

A memory system includes a memory controller comprising n (where n>2) first data input/output terminals, a first semiconductor chip comprising n second data input/output terminals, each of the second data input/output terminals being connected to a respective one of the first data input/output terminals, and a second semiconductor chip comprising n third data input/output terminals, each of the third data input/output terminals being connected to a respective one of the first data input/output terminals. When a first request signal is output from the memory controller, status data of the first semiconductor chip is output from a first of the second data input/output terminals that is connected to a first of the first data input/output terminals, and status data of the second semiconductor chip is output from a second of the third data input/output terminals that is connected to a second of the first data input/output terminals.

13 Claims, 15 Drawing Sheets

(56) References Cited

U.S. PATENT DOCUMENTS

| | | | |
|---|---|---|---|
| 9,507,704 B2* | 11/2016 | Tuers | G06F 12/0238 |
| 9,870,831 B2 | 1/2018 | Nakamura et al. | |
| 2009/0106469 A1* | 4/2009 | Perry | G06F 13/24 |
| | | | 710/268 |
| 2010/0329011 A1* | 12/2010 | Lee | G11C 7/1075 |
| | | | 365/185.17 |
| 2011/0320686 A1* | 12/2011 | Cheng | G06F 13/4086 |
| | | | 711/103 |
| 2013/0124888 A1* | 5/2013 | Tanaka | G11C 16/06 |
| | | | 713/320 |
| 2013/0173852 A1* | 7/2013 | Morita | G11C 16/20 |
| | | | 711/103 |

FOREIGN PATENT DOCUMENTS

| | | |
|---|---|---|
| CN | 101930798 A | 12/2014 |
| CN | 104200840 A | 12/2014 |

\* cited by examiner

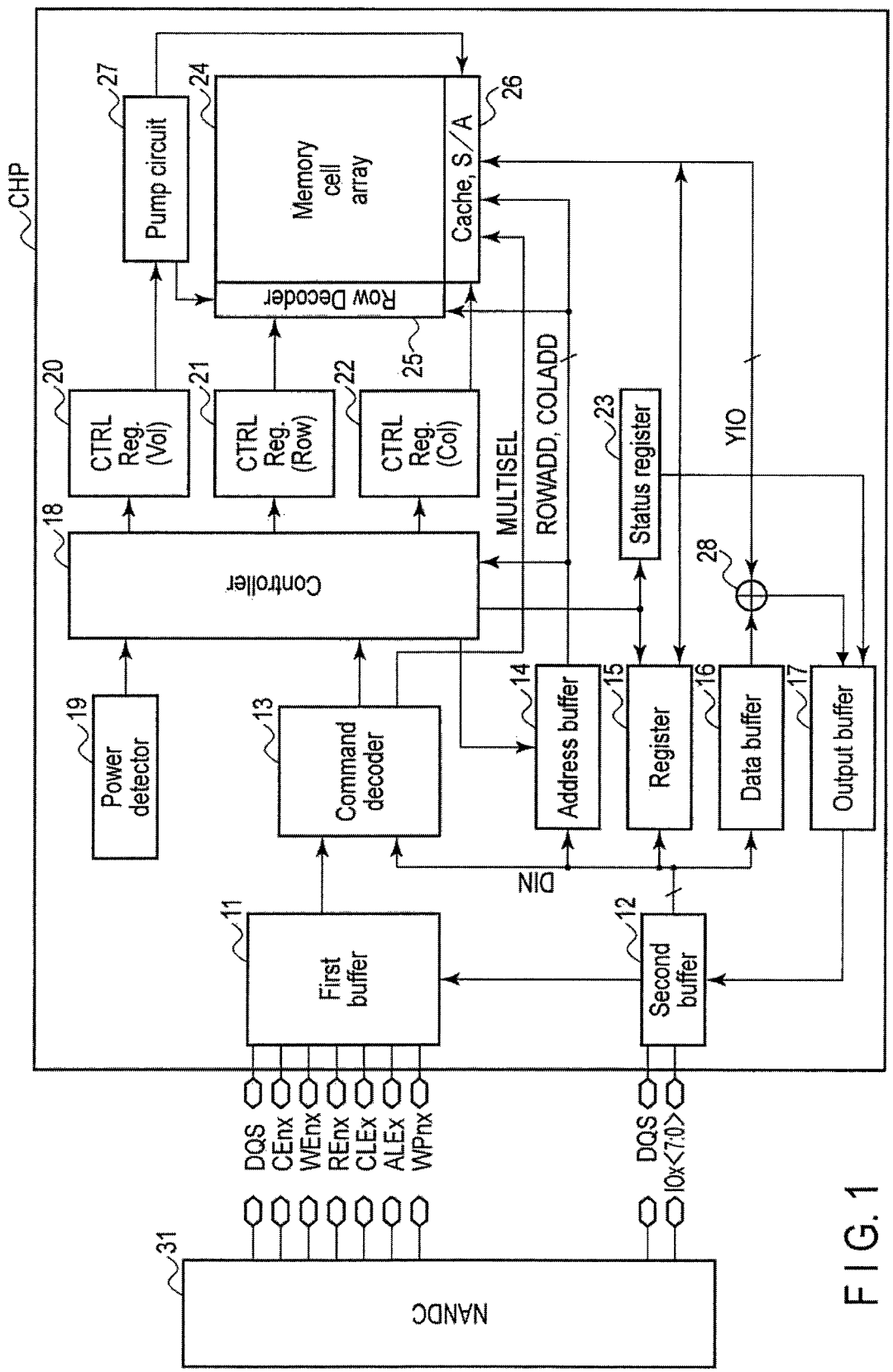
F I G. 1

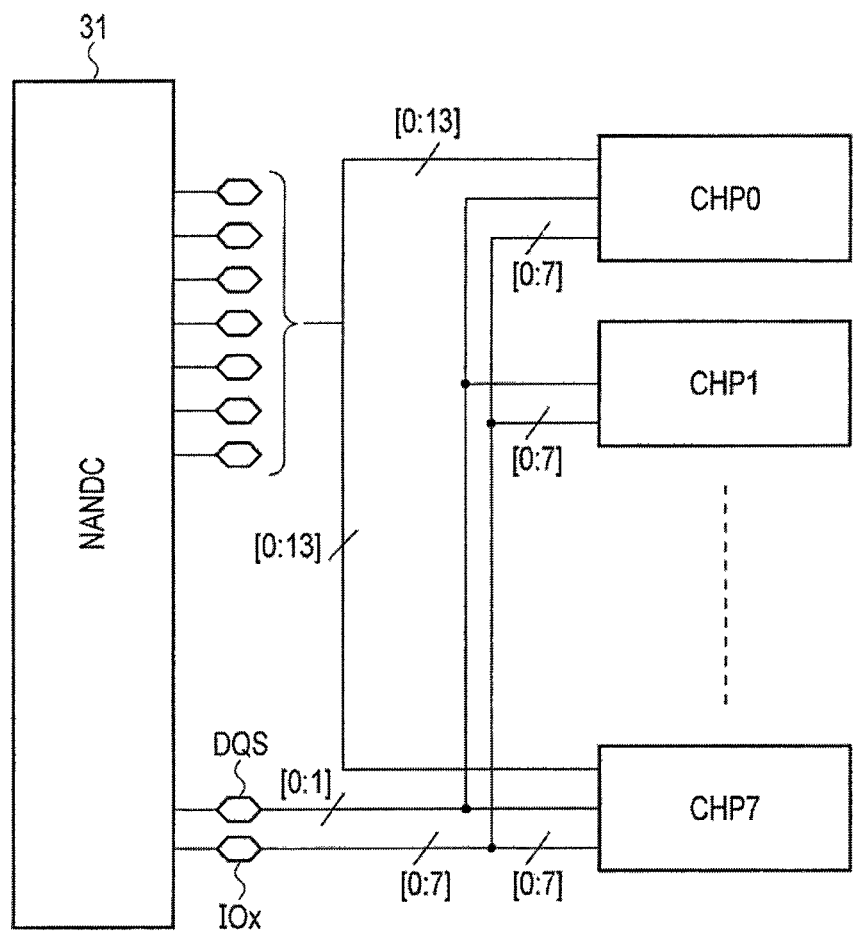
F I G. 4

| CHP3 | CHP2 | CHP1 | CHP0 | CHP0 | CHP3 | CHP2 | CHP1 | CHP0 |
|---|---|---|---|---|---|---|---|---|
| IO7 | IO6 | IO5 | IO4 | IO3 | IO2 | IO1 | IO0 | |
| P/F | P/F | P/F | P/F | R/B | R/B | R/B | R/B | |

FIG. 6

| CHP1 | CHP0 | CHP1 | CHP0 | CHP1 | CHP0 | CHP1 | CHP0 |
|---|---|---|---|---|---|---|---|
| IO7 | IO6 | IO5 | IO4 | IO3 | IO2 | IO1 | IO0 |
| STS1 | STS1 | STS0 | STS0 | P/F | P/F | R/B | R/B |

FIG. 7

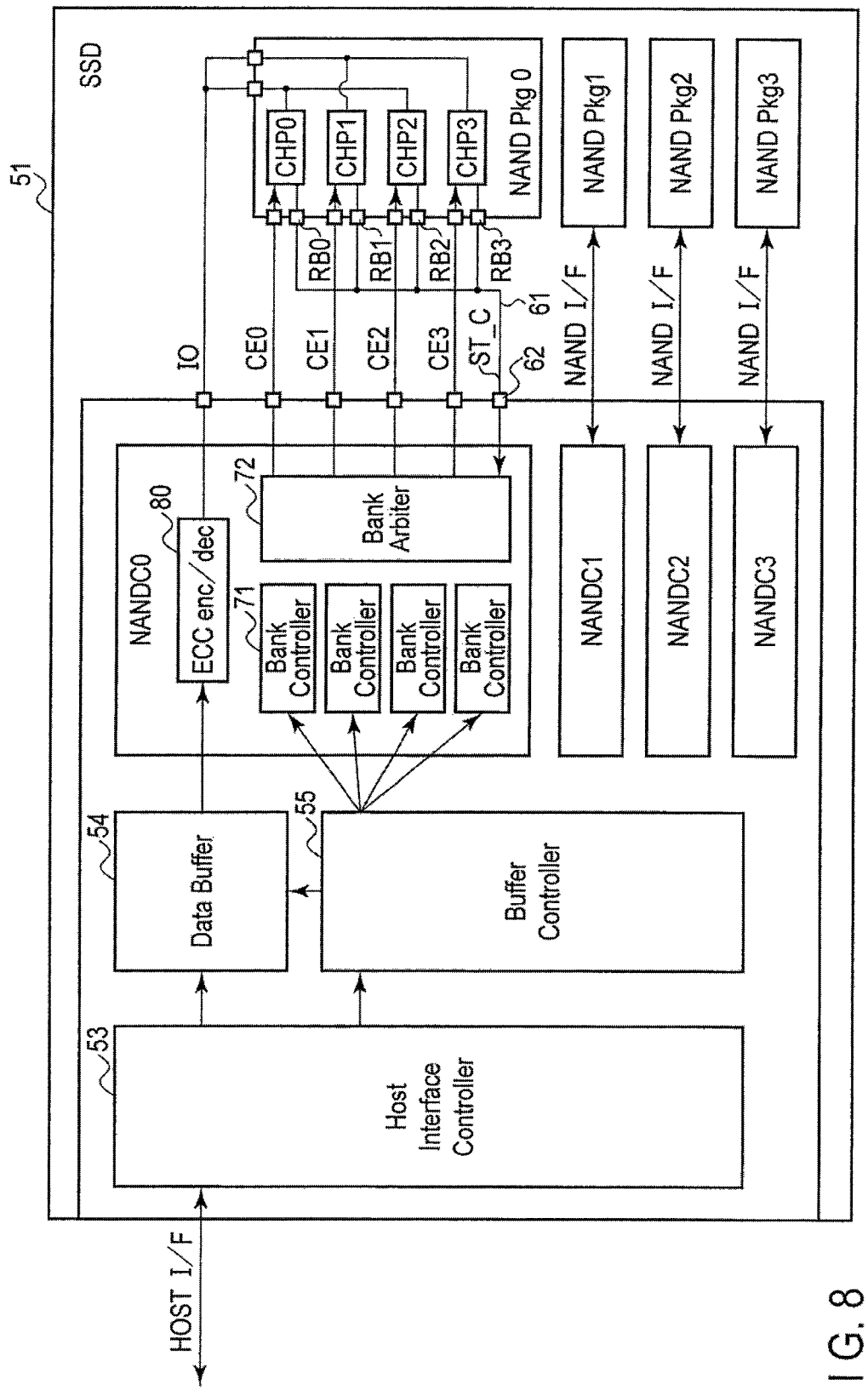
F I G. 8

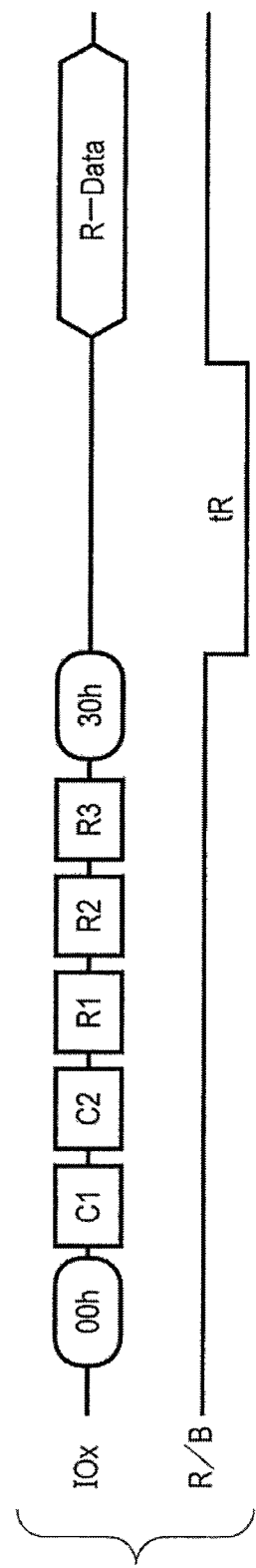
F I G. 13

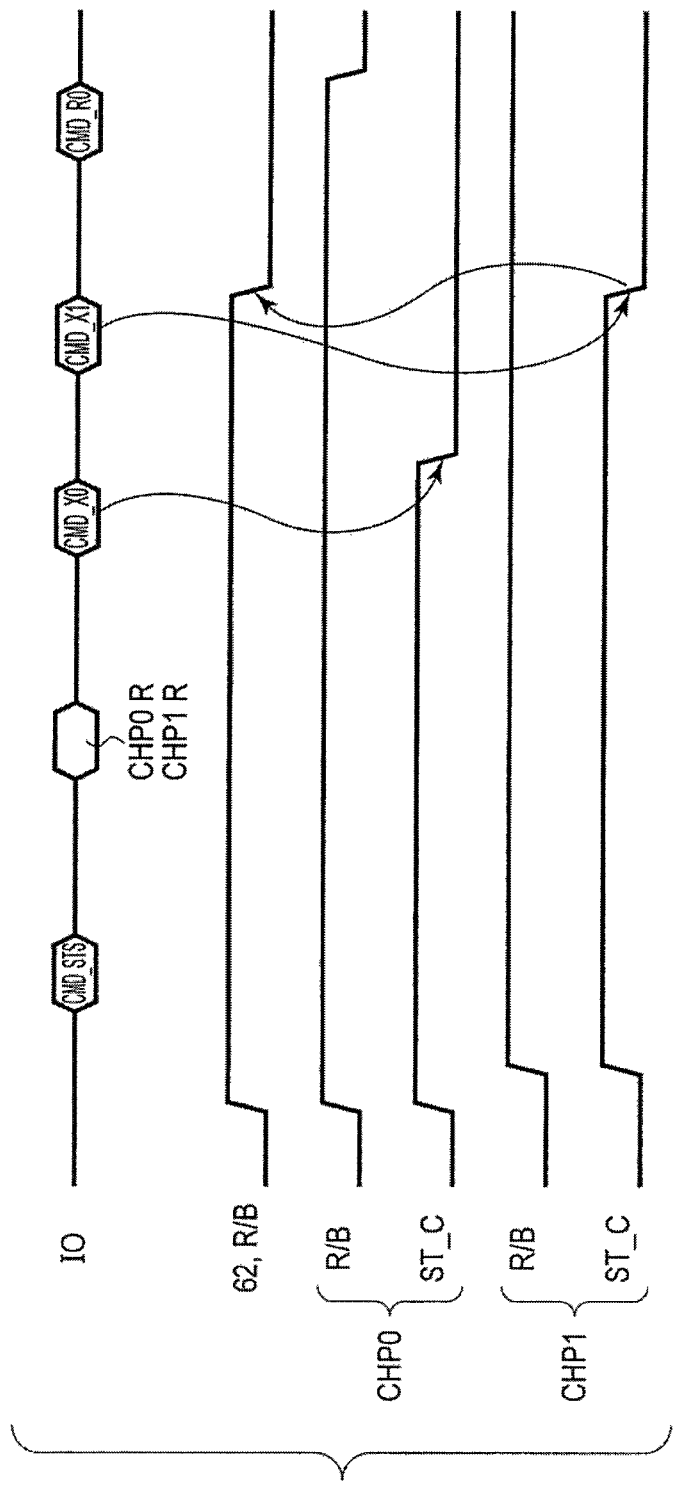
F I G. 15

MEMORY SYSTEM

CROSS-REFERENCE TO RELATED APPLICATION(S)

This application is based upon and claims the benefit of priority from the U.S. Provisional Patent Application No. 62/119,733, filed Feb. 23, 2015, the entire contents of which are incorporated herein by reference.

FIELD

Embodiments described herein relate generally to a memory system including a solid-state drive (SSD).

BACKGROUND

The chip of a NAND flash memory applied to, for example, an SSD, etc., includes a terminal that outputs a ready/busy signal indicating the state of processing inside the chip. The controller of a NAND flash memory is able to determine the state of processing inside a particular NAND flash memory chip when receiving the ready/busy signal output from the NAND flash memory chip, for example by issuing a status read command. However, issuing status read commands for each individual chip in a NAND flash memory can be time-consuming and affect NAND memory performance.

BRIEF DESCRIPTION OF THE DRAWINGS

FIG. 1 is a block diagram showing an example of a memory system according to the first embodiment.

FIG. 4 is a diagram showing an example of the connecting relationship between a plurality of semiconductor chips and a controller.

FIG. 6 is a diagram showing a first modification of the first embodiment.

FIG. 7 is a diagram showing a second modification of the first embodiment.

FIG. 8 is a configuration diagram showing an example of a memory system according to the second embodiment.

FIG. 13 is a diagram illustrating a bank interleaving operation.

FIG. 15 is a waveform chart showing an example of operation of the third embodiment.

DETAILED DESCRIPTION

Figure 2:
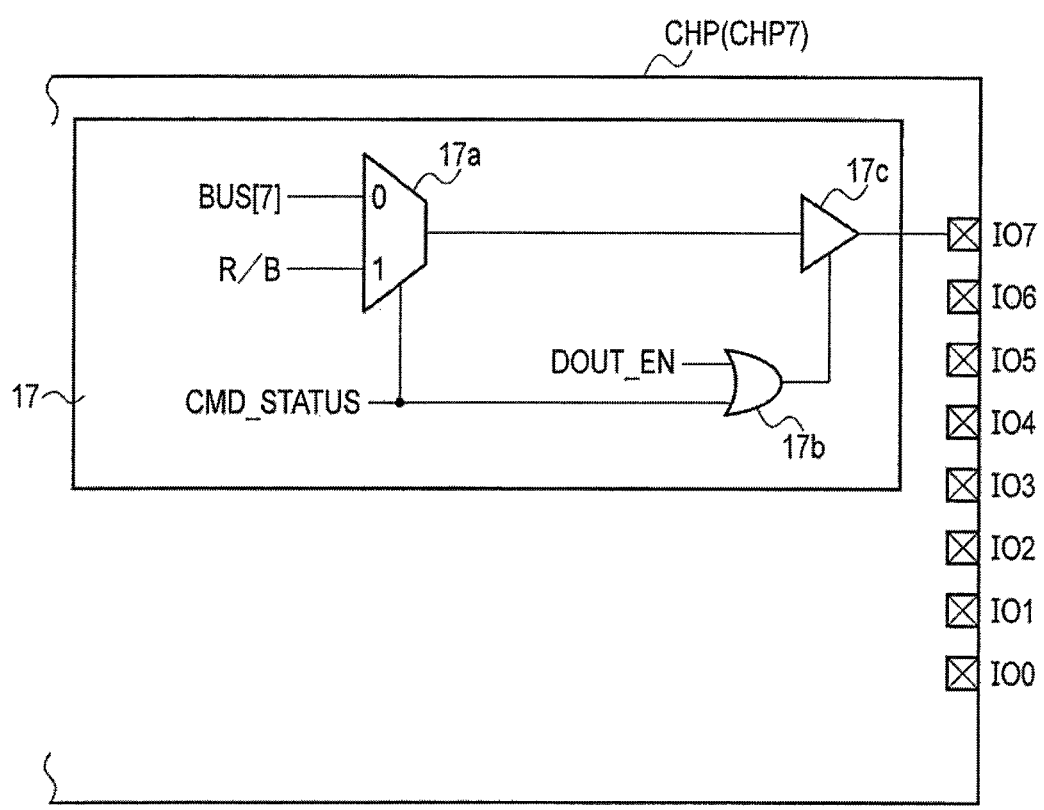
FIG. 2 is a circuit diagram schematically showing the configuration of a NAND chip and an output buffer according to the first embodiment.

In general, according to one embodiment, a memory system comprises: a memory controller, a first semiconductor chip and a second semiconductor chip. The memory controller comprises n first data input/output terminals (where n is an integer having a value of two or more). The first semiconductor chip comprises n second data input/output terminals, each of the second data input/output terminals being connected to a respective one of the first data input/output terminals. The second semiconductor chip comprises n third data input/output terminals, each of the third data input/output terminals being connected to a respective one of the first data input/output terminals in parallel with a respective one of the second data input/output terminals. When a first request signal is output from the memory controller to the first semiconductor chip and the second semiconductor chip, status data of the first semiconductor chip is output from a first of the second data input/output terminals that is connected to a first of the first data input/output terminals, and status data of the second semiconductor chip is output from a second of the third data input/output terminals that is connected to a second of the first data input/output terminals.

An embodiment will now be described with reference to the drawings. In the drawings, identical parts are designated by the same reference symbols.

First Embodiment

FIG. 1 is a block diagram showing an example of a memory system including a NAND flash memory, which may be implemented as part of, for example, an SSD, according to the first embodiment. This memory system comprises, for example, a semiconductor chip (referred to as a NAND chip hereafter) CHP including a NAND flash memory, and a NAND controller (NANDC) 31 configured to control the NAND chip CHP. FIG. 1 shows the case where one NAND chip CHP is connected to the NANDC 31, but as will be explained later, the first embodiment is configured so that a plurality of NAND chips CHPs can be connected to the NANDC 31.

The NAND chip CHP comprises a first buffer 11, a second buffer 12, a command decoder 13, an address buffer 14, a register 15, a data buffer 16, an output buffer 17, a controller 18, a power-source detector 19, a voltage control register 20, a row-system control register 21, a column-system control register 22, a status register 23, a memory cell array 24, a row decoder 25, a sense amplifier 26 including a cache, a pump circuit 27, and a multiplexer 28.

The first buffer 11 comprises a plurality of input terminals to which control signals output from the NANDC 31 are supplied, for example, a chip enable signal CEnx, a write enable signal WEnx, a read enable signal REnx, a command latch enable signal CLEx, an address-latch-enable signal ALEx, a write-protect signal WPnx and a data strobe signal DQS.

The second buffer 12 comprises a plurality of input/output terminals IOx <7:0> and a terminal configured to receive the data strobe signal DQS. For example, when data are written in NAND chip CHP, the input/output terminals IOx receive a write command, including an address and data output from the NANDC 31, and when data are read from NAND chip CHP, the input/output terminals IOx supply the data read from the memory cell array 24 to the NANDC 31. Write data and read data are transferred in synch with the data strobe signal DQS.

A signal supplied to the second buffer 12 is supplied to the first buffer 11, the command decoder 13, the address buffer 14, the register 15, and the data buffer 16.

The command decoder 13 decodes a command supplied from the second buffer 12 according to a control signal supplied from the first buffer 11. This decoded signal is supplied to the controller 18 and the sense amplifier 26.

Upon receipt of an output signal from the power-source detection module 19, the controller 18 controls writing of data, reading of data, erasing of data, and the like, with respect to the memory cell array 24 according to the decoded signal supplied from the command decoder 13 and the address supplied from the address buffer 14. That is, the controller 18 supplies voltage required to execute writing of data, reading of data, erasing of data, and the like with respect to the row decoder 25 or the sense amplifier 26 through the control registers 20, 21, and 22, and the pump circuit 27.

When data are written in NAND chip CHP, the row decoder 25 and the sense amplifier 26 select a memory cell in the memory cell array 24 according to the address supplied from the address buffer 14, and write the data supplied from the data buffer 16 to the memory cell. When data are read from NAND chip CHP, the row decoder 25 and the sense amplifier 26 select a memory cell in the memory cell array 24 according to the address supplied from the address buffer 14, and read data from the selected memory cell.

The output buffer 17 holds the data read from the memory cell and transfers it to the NANDC 31 through the second buffer 12.

Further, the controller 18 outputs a ready/busy signal, which indicates a status as to whether processing such as programming of data, reading data, erasing data, or the like, is being executed with respect to the memory cell array 24. That is, a ready/busy signal indicates whether the memory cell array 24 is in a ready state or a busy state. The ready/busy signal is held in, for example, the status register 23. Status data such as a pass/fail of a program is also held in the status register 23. The ready/busy signal and the like held in the status register 23 are supplied to the output buffer 17, and transferred to the NANDC 31 through the second buffer 12 and the input/output terminal IOx. In this embodiment, a ready/busy signal is transferred according to the data strobe signal DQS supplied to the second buffer 12 based on the second status read command, which is described later.

FIG. 2 shows an example of the NAND chip CHP, the output buffer 17 and the input/output terminal IOx (where x=0-7) shown in FIG. 1. The circuit shown in FIG. 2 corresponds to a portion related to the first embodiment. Accordingly, specific structures related to outputs such as status data corresponding to the data using the second buffer 12 and input/output terminal IOx, a write command, an erase command, etc., are omitted to simplify explanation.

The output buffer 17 includes, for example, selector 17a, OR circuit 17b, and buffer 17c. The structure of the output buffer 17 is not limited to this and may be modified in other embodiments.

The selector 17a comprises first, second, and third input terminals, and an output terminal. When data are read in NAND chip CHP, data read from the memory cell array 24 or the status data output from the status register 23 or the like are supplied to the first input terminal (BUS [7] shown in FIG. 2). The status data include existing status data, for example, a ready/busy signal of a chip corresponding to the first status read command (second request signal) supplied for each chip, a pass/fail signal which indicates the result of a programming operation, and the like.

On the other hand, the ready/busy signal R/B output from the status register 23 is supplied to the second input terminal of selector 17a, and to the third input terminal, a signal CMD_STATUS is supplied, which indicates that a second status read command CMD_STS (first request signal) for reading ready/busy signals collectively from the NANDC 31 has been issued. An output terminal of selector 17a is connected to the input terminal of buffer 17c. Selector 17a selects the second input terminal (R/B) when signal CMD_STATUS is asserted (high level) and selects the first input terminal (BUS [7]) when signal CMD_STATUS is deasserted (low level).

Signal CMD_STATUS, is supplied to the first and second input terminals of OR circuit 17b together with data output enable signal DOUT_EN. An output signal of OR circuit 17b is supplied to the control signal input terminal of buffer 17c.

The output terminal of buffer 17c is connected to, for example, input/output terminal IO7 of input/outputs terminals IO0-IO7 provided in the NAND chip CHP. When a control signal input terminal is at high level, buffer 17c passes the output signal of selector 17a, whereas, when at low level, buffer 17c serves as, for example, high impedance.

In the circuit shown in FIG. 2, for example, when outputting data using the input-outputs terminal IO0-IO7, or when outputting a response to the first status read command, enable signal DOUT_EN is asserted. Further, the circuit is configured so that chip output data are selected from a plurality of chips by a chip address signal (not shown).

FIG. 2 shows the case of the output buffer 17 provided in the 8th NAND chip when, for example, eight NAND chips are connected to the NANDC 31. Thus, the output terminal of buffer 17c is connected to the 8th input/output terminal IO7. Therefore, a ready/busy signal R/B is output from input/output terminal IO7.

Figure 3:
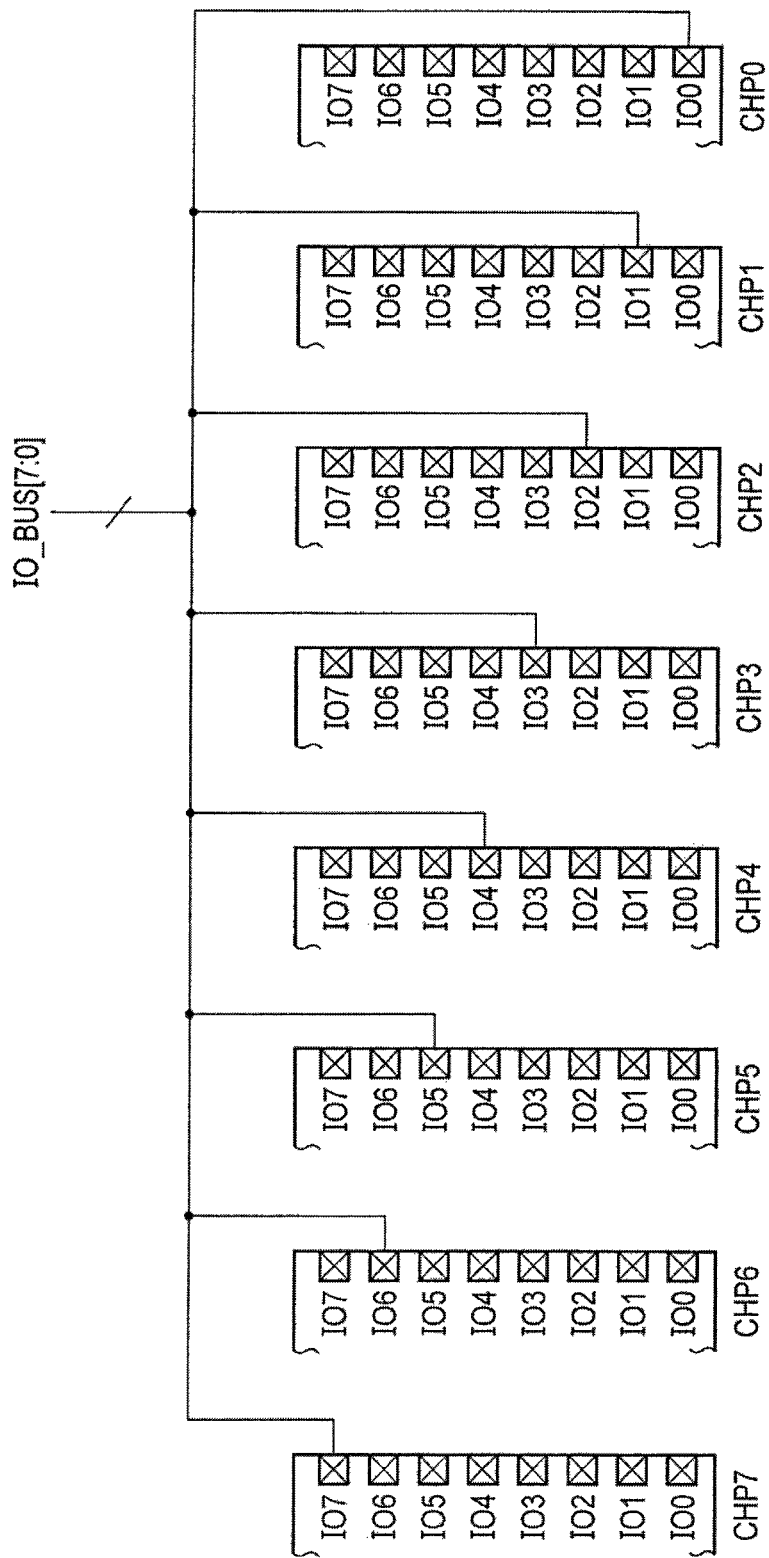
FIG. 3 is a diagram showing an example of assignment of ready/busy signals to input/output terminals of a plurality of semiconductor chips.

FIG. 3 shows the case where ready/busy signals R/B are assigned respectively to input/output terminals IO0-IO7 of the eight NAND chips CHP0-CHP7. As shown in FIG. 3, for NAND chip CHP0, the ready/busy signal R/B is assigned to input/output terminal IO0 and for NAND chip CHP1, the ready/busy signal R/B is assigned to input/output terminal IO1. As for NAND chips CHP2-CHP6, similarly, the ready/busy signals R/B are assigned respectively to the input/output terminals IO2-IO6 of those of the corresponding chip numbers.

In other words, input/output terminal IO0 (the first bit) of NAND chip CHP0 is connected to the first bit (IO0) of the input/output terminal IOx of the NANDC 31, and input/output terminal IO1 (the second bit) of NAND chip CHP1 is connected to the second bit (IO1) of input/output terminal IOx of the NANDC 31. In a similar manner, input/output terminal IO7 of NAND chip CHP7 (the eighth bit) is connected to the eighth bit (IO7) of the input/output terminal IOx of the NANDC 31.

FIG. 4 schematically shows connections of the eight NAND chips CHP0-CHP7 to the NANDC 31. As shown in FIG. 4, the eight NAND chips CHP0-CHP7 are connected in parallel with the NANDC 31. That is, the eight NAND chips CHP0-CHP7 are connected to the NANDC 31 in common. The input/output terminals to which the ready/busy signals R/B of NAND chip CHP0-CHP7 are assigned differ from one NAND chip to another, therefore the NANDC 31 can receive the ready/busy signals R/B of NAND chips CHP0-CHP7 in parallel through the input/output terminals IOx.

That is, when the second status read commands CMD_STS are issued simultaneously to NAND chips CHP0-CHP7 from the NANDC 31, signal CMD_STATUS in each of NAND chips CHP0-CHP7 is asserted, and selector 17a selects the ready/busy signal R/B. The ready/busy signals R/B of NAND chips CHP0-CHP7 are supplied to the NANDC 31 synchronized with data strobe signal DQS as a strobe signal. Therefore, the NANDC 31 can determine the status of each of NAND chips CHP0-CHP7.

Figure 5:
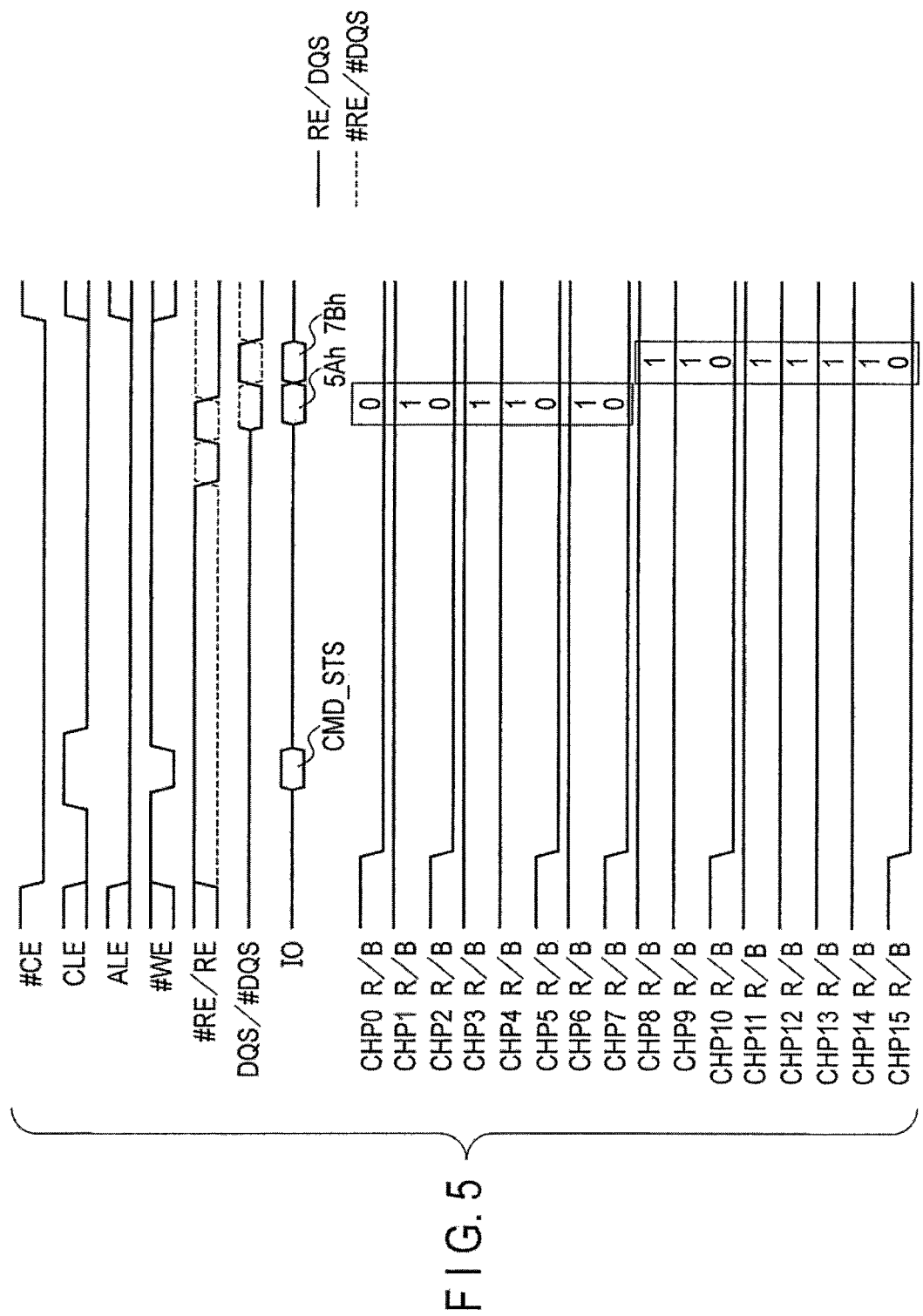
FIG. 5 is a waveform chart showing an example of operation of the first embodiment.

FIG. 5 shows operation of the first embodiment when sixteen NAND chips CHP0-CHP15 are connected in groups of eight in parallel to the NANDC 31. In this case, the second status read commands CMD_STS are issued collectively to the sixteen NAND chips CHP0-CHP15, and thereafter, the ready/busy signals R/B output from NAND chips CHP0-CHP15 are transmitted eight at a time to the NANDC 31 according to data strobe signal DQS/#DQS. Note that in FIG. 5, symbol # indicates a low active signal.

More specifically, NAND chips CHP0-CHP7 are assigned to the first cycle of data strobe signal DQS/#DQS and NAND chips CHP8-CHP15 are assigned to the second cycle of data strobe signal DQS/#DQS. Thus, ready/busy signals R/B can be transmitted to the NANDC 31 from the sixteen NAND chips CHP0-CHP15 by two cycles of data strobe signal DQS/#DQS. In other words, ready/busy signals R/B can be transmitted to the NANDC 31 from the sixteen NAND chips CHP0-CHP15 by time sharing using the data strobe signal DQS.

The example shown in FIG. 5 is described in connection with the case where ready/busy signals R/B are acquired from sixteen NAND chips CHP0-CHP15. Note that the embodiment is not limited to this, but it is also possible to transfer ready/busy signals R/B to the NANDC 31 from seventeen or more NAND chips by using three or more cycles of data strobe signal DQS/#DQS.

Here, there are two possible methods for inputting ready/busy signals R/B output from a plurality of NAND chips in the same cycle.

Figure 16:
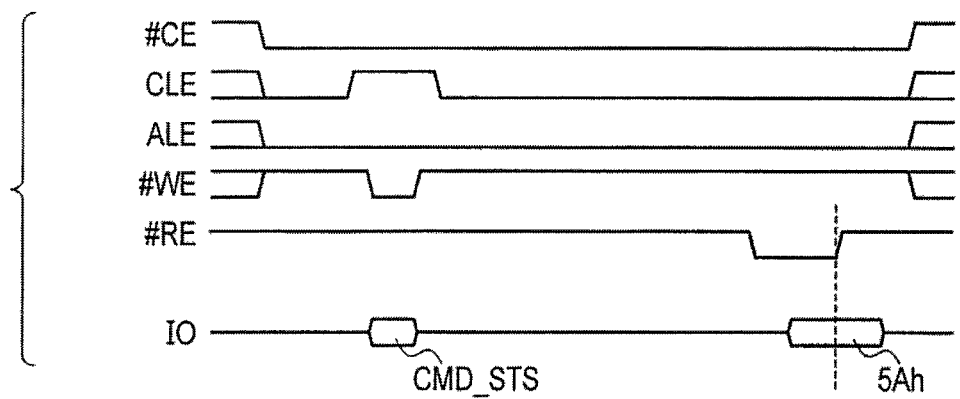
FIG. 16 is a waveform chart showing an example of the operation timing of the first embodiment.

In an example shown in FIG. 16, it is possible to input ready/busy signals R/B output from a plurality of NAND chips simultaneously at a time synchronized with a rise of read enable signal R signal #RE.

Figure 17:
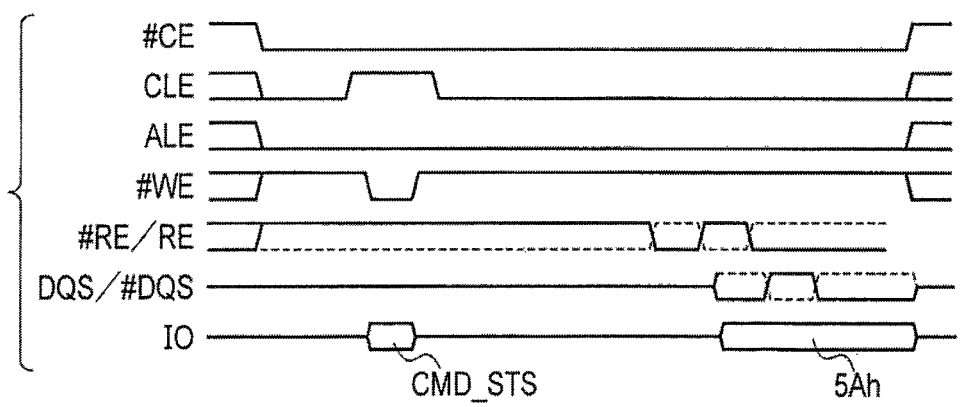
FIG. 17 is a waveform chart showing another example of the operation timing of the first embodiment.

Further, in an example shown in FIG. 17, it is possible to input ready/busy signals R/B output from a plurality of NAND chips simultaneously at the time synchronized with a conversion of data strobe signal DQS/#DQS. In this case, data strobe signal DQS/#DQS is driven, for example, by a NAND chip, and the location of data is indicated.

(Effect of First Embodiment)

According to the first embodiment, one of input/output terminals IO0-IO7 of each of NAND chips is assigned to output a ready/busy signal R/B, and the ready/busy signals R/B from the NAND chips are collectively transferred to the NANDC 31 according to the second status read commands CMD_STS, which are collectively issued from the NANDC 31 to the NAND chips. With this configuration, transfer of the ready/busy signals R/B can be performed at high speed as compared to the case where a status read command is issued to each of the NAND chips and the ready/busy signals R/B are output from the NAND chips sequentially. Therefore, it is possible to perform status read at high speed.

Further, one of the input/output terminals IO0-IO7 for each of a plurality of NAND chips is assigned for outputting a ready/busy signal R/B. For this reason, terminals or wires exclusively for outputting ready/busy signals R/B are not required. Therefore, it is possible to reduce the area of a NAND chip or NANDC.

(Modifications)

The first embodiment is described in connection with the case where more NAND chips are connected to the NANDC 31 than the number of input/output terminals that are available. But it is also possible to connect less NAND chips than the number of input/output terminals to the NANDC 31.

For example, when connecting four NAND chips to the NANDC 31 in parallel, the ready/busy signal R/B is assigned to any of, for example, four input/output terminals IO0-IO3 of eight input/output terminals IO0-IO7 of each NAND chip. With this configuration, other signals can be assigned to the remaining four input/output terminals IO4-IO7.

FIG. 6 shows the first modification. The first modification shows the case where ready/busy signals R/B are assigned to four input/output terminals IO0-IO3 of four NAND chips CHP0-CHP3, and, for example, pass/fail signals P/F are assigned to the rest of four input/output terminals IO4-IO7. A pass/fail signal P/F is a signal which indicates whether a process corresponding to a command such as programming of data or erasing of data has succeeded or failed.

In this case, a selector is provided for each of NAND chips CHP0-CHP3, and selects one of pass/fail signals P/F and data read from the memory cell array 24 corresponding to, for example, input/output terminals IO4-IO7. With the selector, it is possible to transfer pass/fail signals P/F to the NANDC 31 by a method similar to that for transferring the ready/busy signals R/B.

FIG. 7 shows the second modification, which shows the case where, for example, ready/busy signals R/B are assigned to two input/output terminals IO0 and IO1 of two NAND chips CHP0 and CHP1, pass/fail signals P/F are assigned to two input/output terminals IO2 and IO3 of the two NAND chips CHP0 and CHP1, and status signals STS0/STS1, which indicate other states inside chips the two NAND chips CHP1 and CHP1, are assigned to the rest of four input/output terminals IO4-IO7. The status signals STS0/STS1 may also be transferred to the NANDC 31 by a method similar to that for transferring the pass/fail signals P/F or ready/busy signals R/B.

In this case, a selector is provided for each of NAND chips CHP0 and CHP1, and selects one of pass/fail signals P/F and data read from the memory cell array 24 corresponding thereto, for example, input/output terminals IO2 and IO3. Further, a selector is provided for each of NAND chips CHP0 and CHP1, which selects one of status signal STS0 or STS1 and data read from the memory cell array 24 corresponding thereto, for example, input/output terminals IO4-IO7. With these selectors, it is possible to transfer pass/fail signals P/F and status signals STS0 and STS1 to the NANDC 31 by a method similar to that for transferring the ready/busy signals R/B.

An effect similar to that of the first embodiment can be obtained with the first and second modifications, and thereby use input/output terminals with further efficiency.

Further, when one NAND chip is connected to the NANDC 31, an effect similar to that of the first embodiment can be obtained.

Second Embodiment

In the first embodiment, ready/busy signals R/B are output using any of input/output terminals IO0-IO7. By contrast, according to the second embodiment, a signal indicating that the ready/busy signal has been changed is output using a terminal assigned for exclusive use.

FIG. 8 shows a memory system according to the second embodiment, schematically illustrating an example of a plurality of NAND chips CHP0-CHP3 and a NANDC 0. FIG. 8 shows the case where the second embodiment is applied to, for example, an SSD. The second embodiment is not limited to an SSD, but also applicable to other memory systems.

As shown in FIG. 8, an SSD 51 comprises controller 52 and, for example, four NAND packages Pkg0-Pkg3. The controller 52 comprises a host interface controller 53, a data buffer 54, a buffer controller 55 and a plurality of NAND controllers NANDC 0 to NANDC 3.

The host interface controller 53 processes communications with a host device (not shown). The data buffer 54 holds data supplied through the host interface controller 53 during the period in which the data are transferred to NANDC 0 to NANDC 3. Further, the data buffer 54 holds data supplied from NANDC 0 to NANDC 3 during the period in which the data are transferred to a host device.

The buffer controller 55 controls operations of the data buffer 54 and NANDC 0 to NANDC 3. NANDC 0 to NANDC 3 control the NAND chips included in NAND packages Pkg0-Pkg3.

The structure of each of NANDC 1 to NANDC 3 is similar to that of NANDC 0, and the structure of each of NAND packages Pkg1-Pkg3 is similar to that of NAND package Pkg0. Here, the structure will now be described focusing on the NANDC 0 and NAND package Pkg0.

NANDC 0 controls program, read, erase and the like of the data with respect to NAND chips CHP0-CHP3 included in NAND package Pkg0. NANDC 0 comprises a plurality of bank controllers 71, a bank arbiter 72, an encoder/decoder 80 of ECC, etc. The details of NANDC 0 will be described below.

NANDC 0 is connected to a plurality of NAND chips CHP0-CHP3 by one I/O bus. That is, NAND chips CHP0-CHP3 are connected in parallel by one I/O bus to NANDC 0. The I/O bus is connected to input/output terminal IOx of each of NAND chip CHP0-CHP3 as shown in FIG. 1.

Via the I/O bus, data, command, and address are transferred to a plurality of NAND chips CHP0-CHP3 from NANDC 0. Further, data and the like read from the memory cell array of NAND chips CHP0-CHP3 are transmitted to NANDC 0 via the I/O bus.

Furthermore, as will be described below, when the first status read command CMD_Yx (x=0, 1, . . . ) is issued from NANDC 0 to each of NAND chips CHP0-CHP3, the status data (ready/busy) output from NAND chips CHP0-CHP3 is also transferred to NANDC 0 via the I/O bus as a response to the first status read command CMD_Yx.

Each of NAND chips CHP0-CHP3 is controlled by control signals supplied from NANDC 0, for example, the chip enable signal, the write enable signal, the read enable signal, the command latch enable signal, the address-latch-enable signal, the write-protect signal and the data strobe signal. FIG. 8 shows only chip enable signals CE0-CE3. The chip enable signals CE0-CE3 output from NANDC 0 are supplied to the NAND chips CHP0-CHP3, respectively.

Further, NAND chips CHP0-CHP3 respectively comprise output terminals RB0-RB3 configured to output signal ST_C, which indicates that the status data (ready/busy) in a NAND chip has changed. The output terminals RB0-RB3 are connected in common by a wire 61, and the signals ST_C output from the output terminals RB0-RB3 are subjected to a wired OR operation. The wire 61 is connected to an input terminal (referred to as RB terminal hereafter) 62 connected to NANDC 0, and the signal ST_C subjected to a wired OR operation is supplied to NANDC 0 via the RB terminal 62.

NANDC 0 is able to perform an operation (referred to as bank interleaving hereafter) of data transfer to NAND chip CHP1, for example, when NAND chip CHP0 is in a busy state. Therefore, a plurality of bank controllers 71 manages the progress of a command on every bank (NAND chip). Here, the bank interleaving will now be described.

In FIG. 8, output terminals RB0-RB3 of NAND chips CHP0-CHP3 are connected by the wire 61 exterior to NAND package Pkg0, but output terminals RB0-RB3 may be connected inside NAND package Pkg0.

FIG. 8 shows the configuration in which a plurality of NANDC 0 to NANDC 3 are connected with a plurality of NAND packages Pkg0-Pkg3 by a plurality of NAND interfaces (I/F). Note that the number of NANDCs and NAND packages is not limited to this, but the configuration may include one NANDC and one NAND package.

Further, in FIG. 8, one NAND package includes four NAND chips CHP0-CHP3. Note that the configuration is not limited to this, for example, one NAND package may include one NAND chip.

NAND chips CHP0-CHP3 comprise an output buffer 17 as in the first embodiment.

Figure 9:
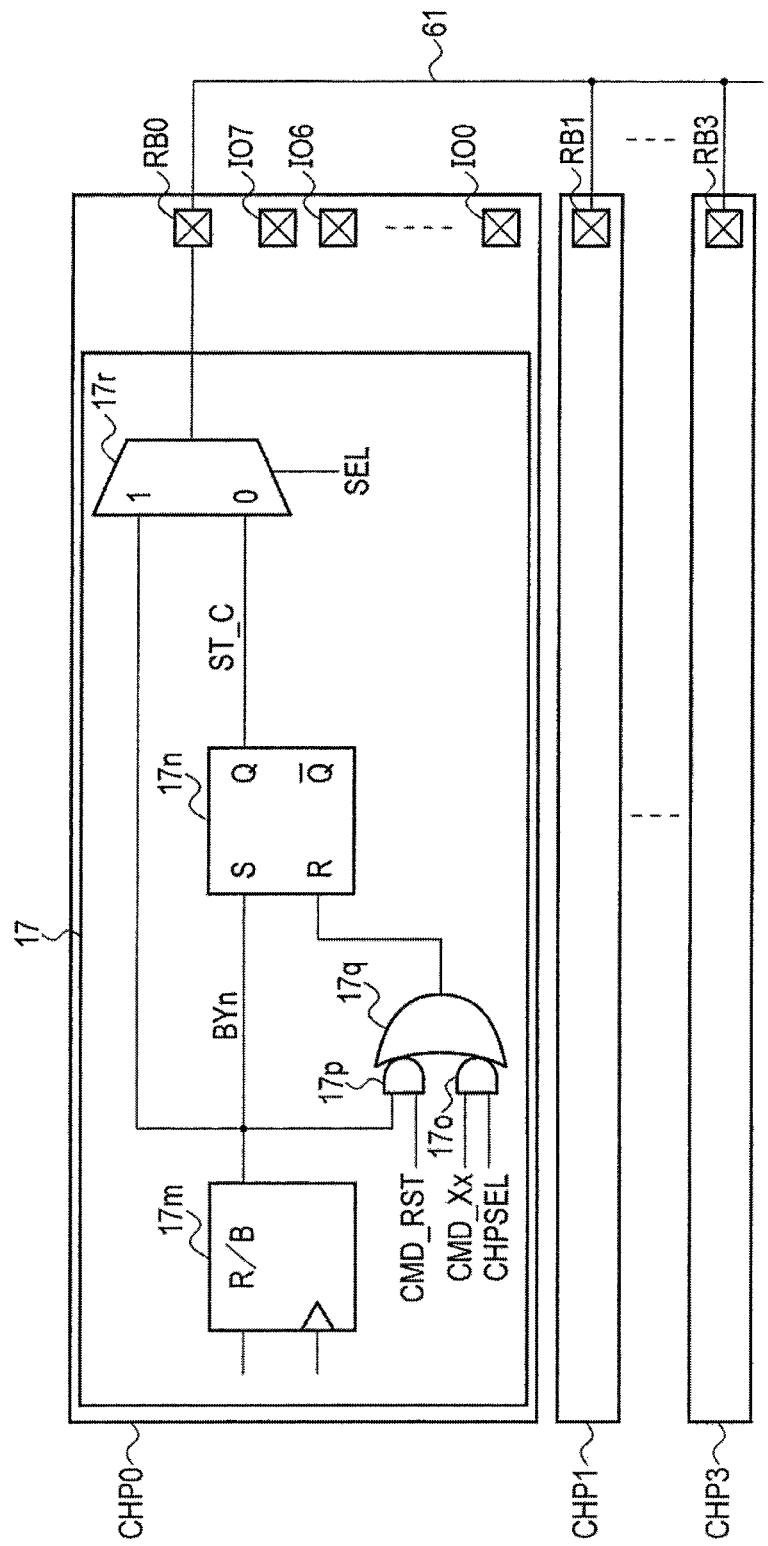
FIG. 9 is a circuit diagram schematically showing a structure of a NAND chip and an output buffer according to the second embodiment.

FIG. 9 schematically shows an example of the configuration of the output buffer 17 and NAND chips CHP0-CHP3 according to the second embodiment. An output buffer 17 of a similar structure to that of NAND chip CHP0 is provided for NAND chips CHP1-CHP3 as well.

The output buffer 17 comprises a register 17m, a flip-flop circuit 17n, AND circuits 17o and 17p, an OR circuit 17q and a selector 17r. The register 17m holds the ready/busy signal R/B supplied from the status register 23. The flip-flop circuit 17n is set by rise of an output signal BY of the register 17m and outputs signal ST_C which indicates that the status data in NAND chip CHP0 has changed from an output terminal Q.

The output signal BY of the register 17m is supplied to the first input terminal of the selector 17r and signal ST_C is supplied to the second input terminal. A control signal SEL is supplied to the control signal input terminal of the selector 17r. The signal SEL is set to a high level, for example at the time of shipment of the product, which enables the product to perform operations compatibly with conventional devices which are not yet compatible with the operational mode of this embodiment. On the other hand, the devices compatible with the operational mode of this embodiment are set to the operational mode by setting the control signal SEL to a low level, for example, by a command. For this reason, the selector 17r is set to select the output of flip-flop circuit 17n. The output terminal of the selector 17r is connected to output terminal RB0.

Flip-flop circuit 17n is reset when a clear command for the output of terminal RB0 is issued from NANDC 0. More specifically, when NAND chip CHP0 receives a clear command, signal CMD_Xx supplied to the first input terminal of AND circuit 17o and chip select signal CHPSEL supplied to the second input terminal are asserted (high-level). Therefore, the output of AND circuit 17o is made high-level, the output of OR circuit 17q is made high-level, and flip-flop circuit 17n is reset.

Further, flip-flop circuit 17n is reset by a reset command of NAND chip CHP0 output from NANDC 0. More specifically, when NAND chip CHP0 receives a reset command, signal CMD_RST supplied to the second input terminal of AND circuit 17p is asserted. Output signal BYn of the register 17m is supplied to the first input terminal of AND circuit 17p. Therefore, the output of AND circuit 17p is set to a high level and the output of OR circuit 17q is set to a high level, and flip-flop circuit 17n is reset.

Figure 10:
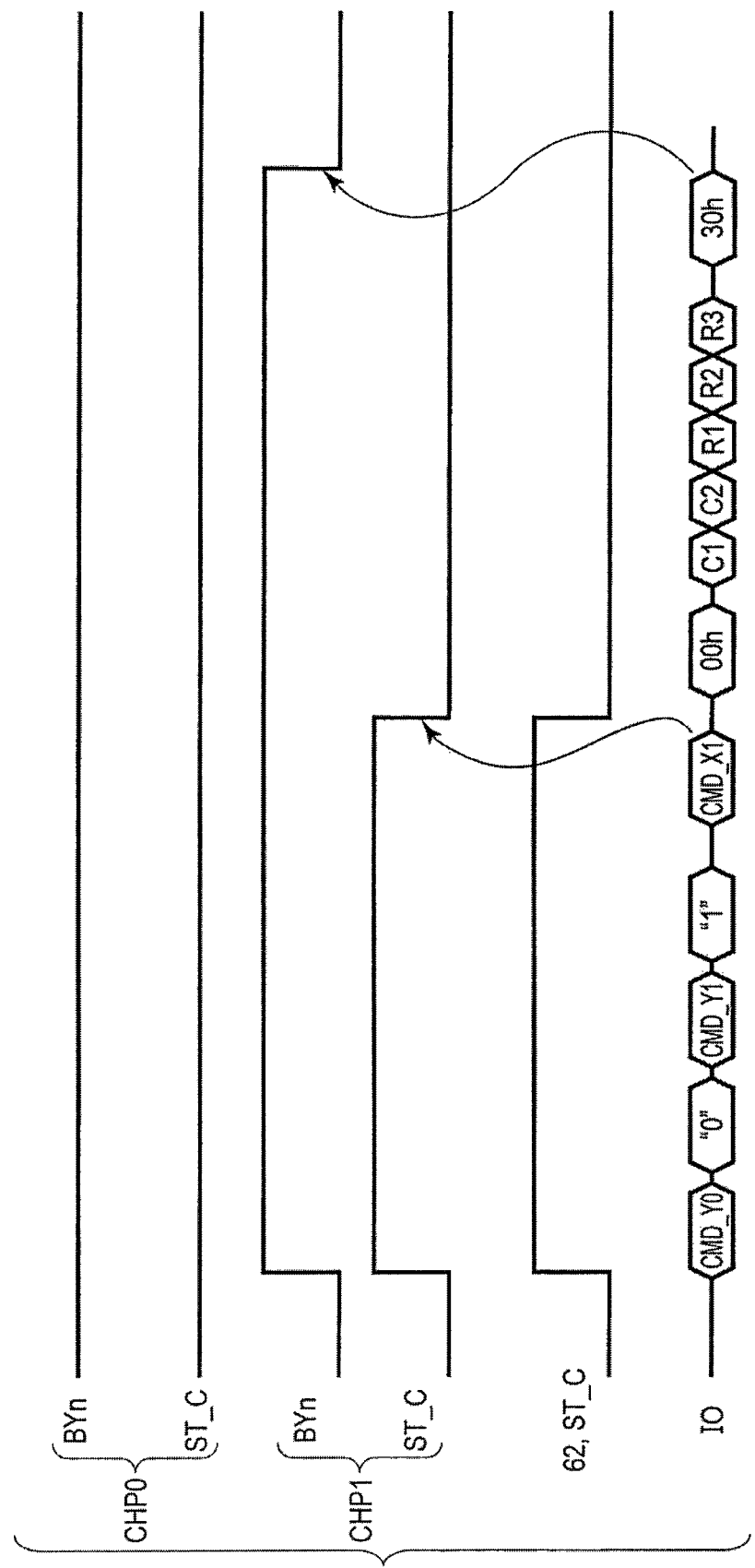
FIG. 10 is a waveform chart showing an example of operation of the second embodiment.

FIG. 10 shows an example of operation of the second embodiment. FIG. 10 illustrates NAND chip CHP0 and NAND chip CHP1 as typical members to simplify the explanation. In FIG. 10, CMD_Y0 of the I/O bus is an example of the first status read command to confirm the status of NAND chip CHP0, CMD_Y1 is an example of the first status read command to confirm the status of NAND chip CHP1, CMD_X1 is an example of the command to deassert output terminals RB0-RB3 which output a ready/busy signal RY/BY of each of NAND chips CHP0-CHP3, and 00h-C1-C2-R1-R2-R3-30h is an example of a read command to instruct read of data to NAND chip CHP1.

In the example shown in FIG. 10, for example, output signal BYn of register 17m of NAND chip CHP0 is in the busy state (low level) and output signal ST_C of flip-flop circuit 17n is at low level. Output signal BYn of register 17m of NAND chip CHP1 is in the ready state (high level) and output signal ST_C of flip-flop circuit 17n is at high level. Therefore, output terminal RB0 of NAND chip CHP0 is at low level, and output terminal RB1 of NAND chip CHP1 is at high level. Therefore, signal ST_C of the wire 61 (RB terminal 62) is at high level.

NANDC 0 issues command CMD_Y0 to confirm the status of NAND chip CHP0 via the I/O bus based on a current level of signal ST_C supplied via the RB terminal 62.

NAND chip CHP0 notifies the NANDC via the I/O bus that it is in the busy state as a response to command CMD_Y0.

Subsequently, when command CMD_Y1 to confirm the status of NAND chip CHP1 is transmitted via the I/O bus from NANDC 0, NAND chip CHP1 notifies NANDC 0 via the I/O bus that it is in the ready state ("1").

After that, NANDC 0 issues clear command CMD_X1 to clear signal ST_C of NAND chip CHP1 which is in the ready state. When NAND chip CHP1 receives clear command CMD_X1, flip-flop circuit 17n is reset, and output signal ST_C of flip-flop circuit 17n is made low level. Accordingly, signal ST_C of the RB terminal 62 is made low level.

Subsequently, based on deassertion of signal ST_C of the RB terminal 62, read command 00h-C1-C2-R1-R2-R3-30h, which instructs NAND chip CHP1 to read data, is issued from NANDC 0. If the NAND chip CHP1 receives a read command, NAND chip CHP1 transitions into a busy state and output signal BYn of the register 17m of NAND chip CHP1 is made low level.

Figure 11:
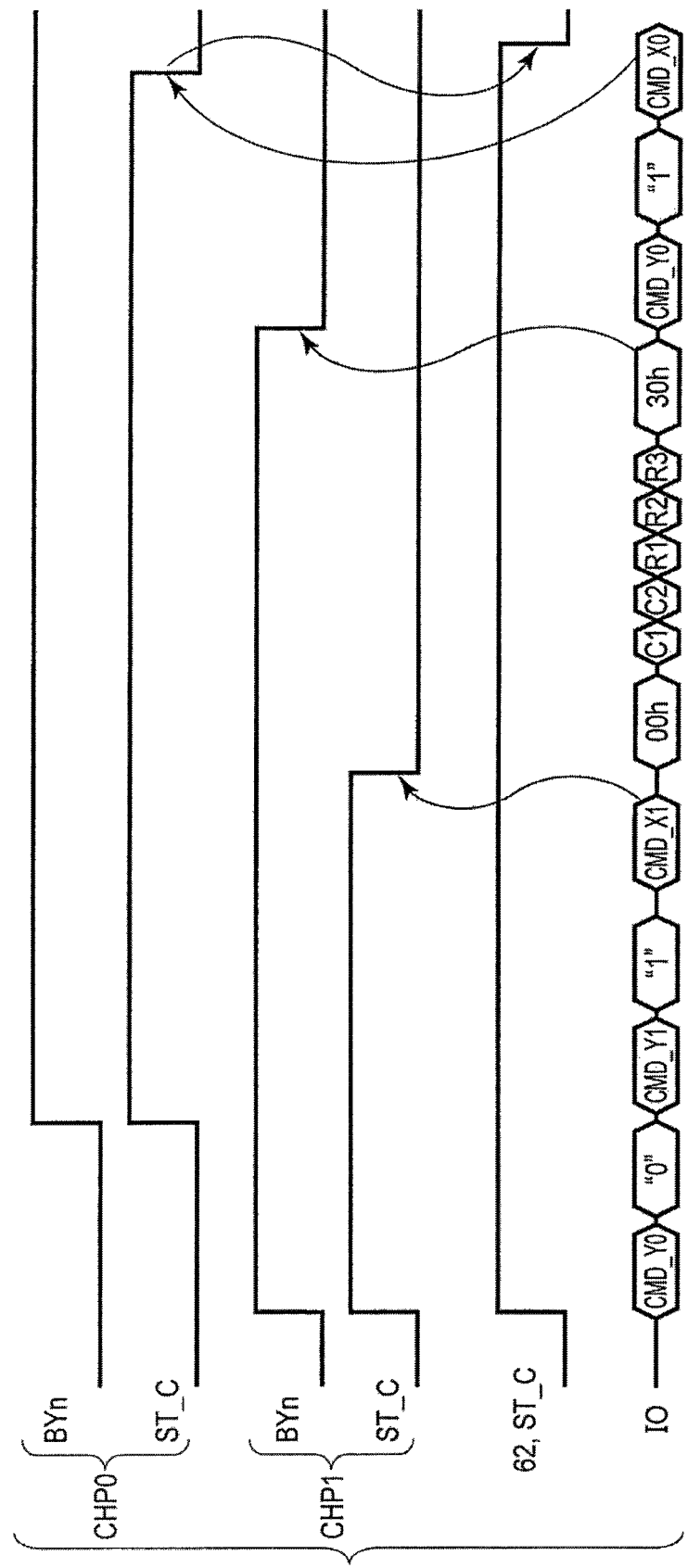
FIG. 11 is a waveform chart showing an example of another operation of the second embodiment.

FIG. 11 shows an example of another operation of the second embodiment. In the example shown in FIG. 10, the status of only NAND chip CHP1 transitions. In contrast, the example shown in FIG. 11 illustrates that the statuses of both NAND chip CHP0 and NAND chip CHP1 transition.

In the example shown in FIG. 11, for example, output signal BYn of register 17m of NAND chip CHP0 is in the busy state (low level) and output signal ST_C of flip-flop circuit 17n is at low level. Output signal BYn of register 17m of NAND chip CHP1 is in the ready state (high level) and output signal ST_C of flip-flop circuit 17n is at high level. Therefore, signal ST_C output from output terminal RB0 of NAND chip CHP0 is at low level, and signal ST_C output from output terminal RB1 of NAND chip CHP1 is at high level. Accordingly, signal ST_C of the RB terminal 62 of NANDC 0 is at high-level.

NANDC 0 issues the first status read commands CMD_Y0 and CMD_Y1 sequentially to NAND chip CHP0 and CHP1 when signal ST_C supplied via the RB terminal 62 is at high level. Based on responses of the first status read command CMD_Y0 and CMD_Y1, the NAND chip CHP0 is able to confirm that NANDC 0 is in the busy state ("0") and NAND chip CHP1 is in the ready state ("1").

Then, NANDC 0 issues clear command CMD_X1 to clear signal ST_C of NAND chip CHP1, which is in the ready state. Therefore, output signal ST_C of flip-flop circuit 17n of NAND chip CHP1 is made low level. It is noted that the operation described up to this point is similar to that shown in FIG. 10.

However, after sending a response of the busy state to command CMD_Y0, NAND chip CHP0 transitions from the busy state to the ready state. Therefore, output signal ST_C of flip-flop circuit 17n of NAND chip CHP0 is made high level and output terminal RB0 is made high level. Thus, even if output signal ST_C of flip-flop circuit 17n of NAND chip CHP1 is cleared by clear command CMD_X1, signal ST_C of the RB terminal 62 of the NANDC 0 is kept high level and is not deasserted.

NANDC 0, having been able to confirm that NAND chip CHP1 is in the ready state, issues read command 00h-C1-C2-R1-R2-R3-30h to NAND chip CHP1.

After that, in response to the assertion of the RB terminal 62, the NANDC issues the first status read command CMD_Y0 to NAND chip CHP0.

NANDC 0 confirms that the response from NAND chip CHP0 is in the ready state and issues clear command CMD_X0 to NAND chip CHP0. According to the clear command CMD_X0, output terminal RB0 of NAND chip CHP0 is made low level and the RB terminal 62 is deasserted.

(Effect of Second Embodiment)

According to the second embodiment described above, the status data which indicates ready/busy of NAND chips CHP0-CHP3 is supplied to the NANDC 0 via the I/O bus. NAND chips CHP0-CHP3 respectively comprise output terminals RB0-RB3 configured to output signal ST_C, which indicates that status data changed, and NANDC 0 comprises one RB terminal 62 configured to receive signals ST_C output from output terminals RB0-RB3, which are subjected to a wired OR operation. Therefore, NANDC 0 is not required to have terminals equal to the number of NAND chips CHP0-CHP3 in order to acquire the status data of all NAND chips CHP0-CHP3. Thus, it is possible to prevent enlargement of the size of NANDC 0 and also the size of a system-on-a-chip (SoC) including NANDC 0 and NAND chips CHPCHP0-CHP3.

Moreover, in the second embodiment, when signal ST_C is asserted, the first status read command CMD_Yx is issued from NANDC 0 and signal ST_C is reset by clear command CMD_Xx issued from NANDC 0 based on a response of the first status read command CMD_Yx. In this manner, NANDC 0 is able to control unnecessary issuance of the status read command CMD_Yx, thus making the timing of the issuance of the first status read command CMD_Yx appropriate. Therefore, the issue count of the first status read commands CMD_Yx can be reduced and the power consumption can be reduced.

For example, when the issue interval of the first status read commands is prolonged, the end of a busy state may not be recognized, causing degradation in performance. But according to the second embodiment, it is possible to issue the first status read commands CMD_Yx at appropriate times, thus preventing such degradation in performance.

(Bank Interleaving)

As described above, for example, when NAND chip CHP0 is in the busy state, NANDC 0 executes bank interleaving, in which data is transfer to NAND chip CHP1.

Figure 12:
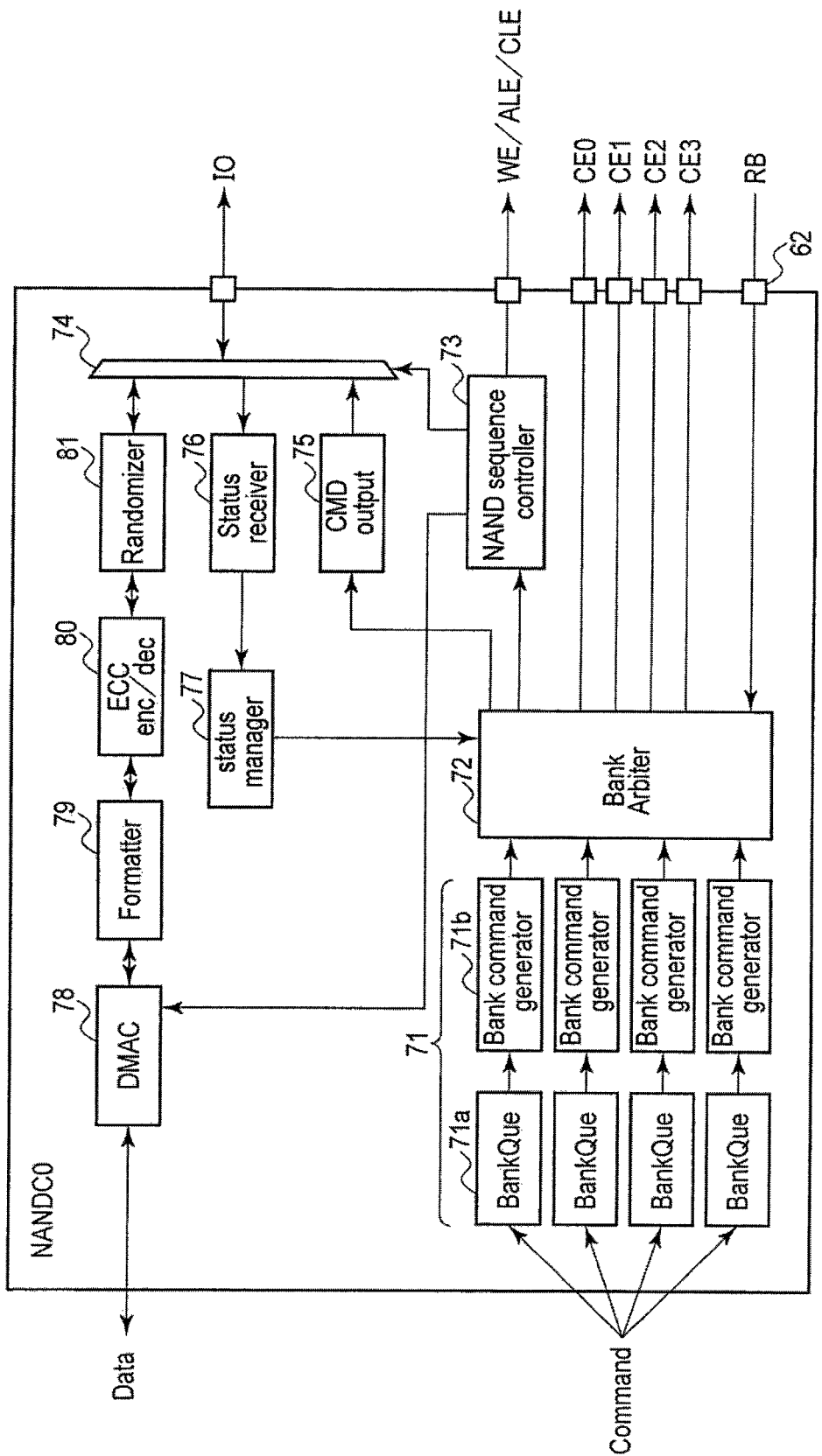
FIG. 12 is a configuration diagram showing an example of a NAND controller.

FIGS. 12 and 13 illustrate an example of bank interleaving operation and FIG. 12 shows the structure of NANDC 0.

As shown in FIG. 12, NANDC 0 comprises bank controllers 71, a bank arbiter 72, a NAND sequence controller 73, a multiplexer 74, a command (CMD) output 75, a status receiver 76, a NAND status manager 77, a direct memory access controller (DMAC) 78, a formatter 79, an encoder/decoder 80 of ECC, a randomizer 81, and the like.

A plurality of bank controllers 71 each comprise a bank queue 71a and a bank command generator 72b.

A command supplied to NANDC 0 is divided into each bank and is held in a bank queue 71a. The bank queue 71a is, for example, a first-in-first-out buffer, where a leading command is supplied to a bank command generator 71b.

The bank command generator 71b is configured to divide the input command into each unit to be subjected to bank interleaving and supplies each unit to the bank arbiter 72. Bank interleaving is an operation which, when one of a plurality of the NAND chips is in the busy state, accesses other NAND chips which share the I/O bus. Thus, the unit of bank interleaving is a command unit which accesses one NAND chip. That is, the unit of bank interleaving is a command group divided by the busy time of a command (for example, tR in the case of read) as shown in FIG. 13. In the case of the read command shown in FIG. 13, two commands 00h and 30h are produced by the bank command generator 71b. Note that the unit of bank interleaving is not limited to the read command, but it is also applicable for program commands or erase commands.

The bank arbiter 72 is configured to receive an execution request of a command supplied for each bank from the bank command generator 71b, signal ST_C, which indicates that the status of a chip supplied from the RB terminal 62 has transitioned, and a status of each bank supplied via the status receiver 76 and the NAND status manager 77. The bank arbiter 72 selects one command (including the first status read command) to be executed on a NAND chip based on this information, and transfers it to the NAND sequence controller 73. That is, the bank arbiter 72 asserts one of the chip enable signals CE0-CE3 which corresponds to the bank to be accessed.

According to the command requested by the bank arbiter 72, the NAND sequence controller 73 controls the multiplexer 74 and executes communications between NAND chips CHP0-CHP3 and NANDC 0. More specifically, the communications are carried out by controlling the multiplexer 74 to selectively connect the command output module 75, the status receiver 76, or the randomizer 81 to the I/O.

The command output module 75 transmits the command supplied from the bank arbiter 72 through the I/O. The status receiver 76 receives the status data of NAND chips CHP0-CHP3 supplied from the I/O and supplies it to the status manager 77. The status manager 77 supplies the status data of NAND chips CHP0-CHP3 to the bank arbiter 72.

For example, when performing data transfer, or more specifically writing data in a NAND chip, the NAND sequence controller 73 starts a DMAC 78 in order to acquire the data from the data buffer 54 shown, for example, in FIG. 8. The formatter 79 is configured to convert data supplied from the DMAC 78 into a format to be stored in the NAND chip. The encoder/decoder 80 of ECC is configured to add an error correction code to the data supplied from the formatter 79. The randomizer 81 is configured to randomize the data supplied from the encoder/decoder 80 and transmits the data to the NAND chip.

The NAND sequence controller 73 is configured to send a completion notification to the bank arbiter 72, after executing the command requested by the bank arbiter 72. The bank arbiter 72 selects the command to execute next when a completion notification is received. Such operation is repeated and bank interleaving is executed.

Note that the above description is provided in connection with the case where data is transferred to NAND chip CHP1 when NAND chip CHP0 is in the busy state, but the embodiment is not limited to this. For example, there may be such a case where, for example, two NAND chips are both in the busy state. Further, let us suppose, for example, the case of subjecting reading of NAND chip CHP0 and reading of NAND chip CHP1 to bank interleaving. Note here that NAND chip CHP0 may be in the busy state (period of tR shown in FIG. 13) and NAND chip CHP1 may also be in the busy state (tR). This is also the case for the program busy state (tPROG [not shown]) or the erase busy state (tBERASE [not shown]). Note here that erase is not accompanied by data transfer.

Furthermore, in bank interleaving, a command group executed by a plurality of NAND chips does not necessarily comprise the same commands, but commands mutually different from each other. For example, when two NAND chips are both reading data or two NAND chips are both erasing data, bank interleaving is possible. Also in such combinations of read and erase, read and program, and erase and program, bank interleaving is possible. Further, bank interleaving by three or more NAND chips is also possible.

Third Embodiment

Figure 14:
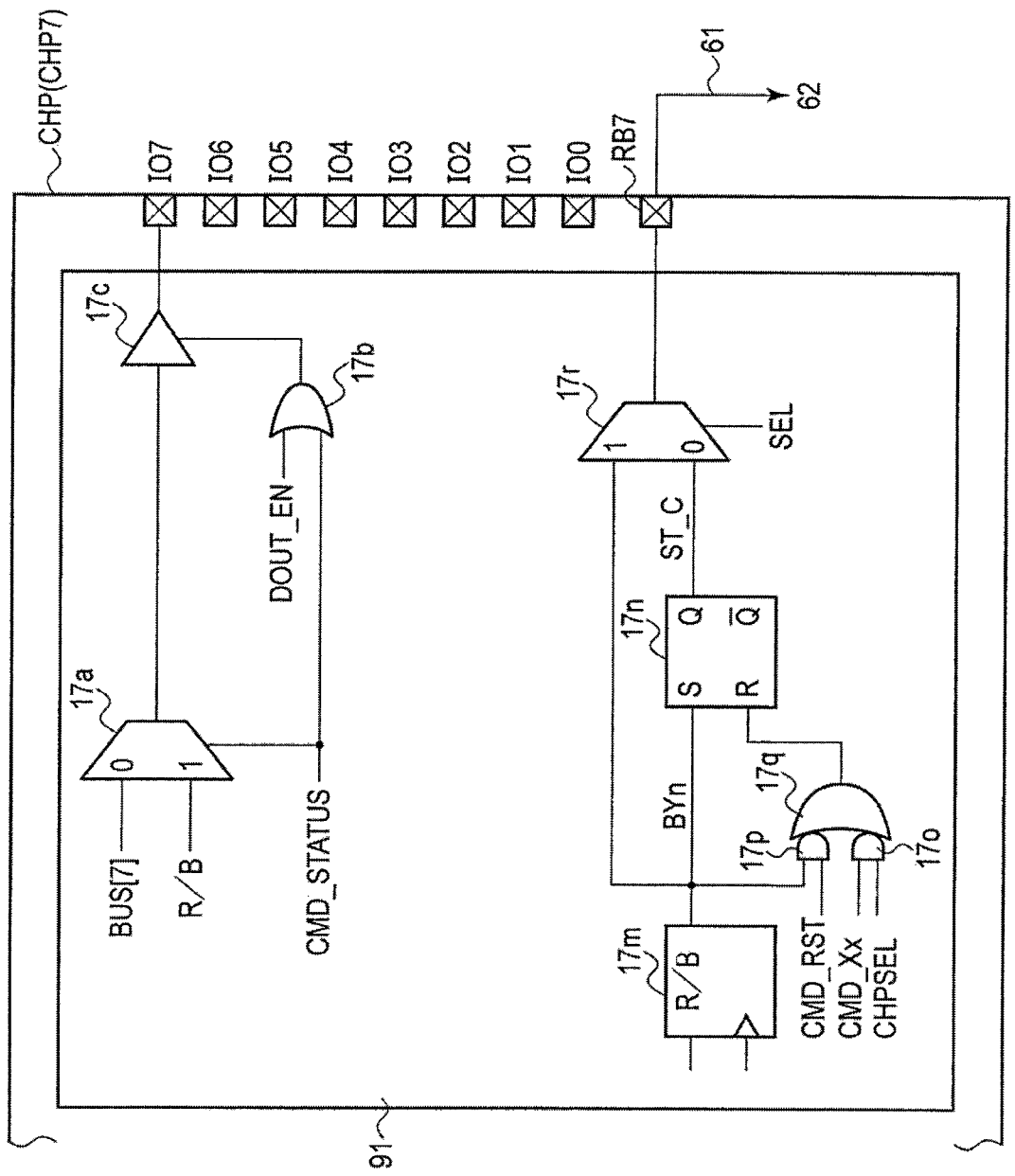
FIG. 14 is a circuit diagram schematically showing an example of a NAND chip and an output buffer according to the third embodiment.

FIG. 14 shows an example of NAND chip CHP and an output buffer 91 according to the third embodiment. The third embodiment is a combination of the first and second embodiments.

The output circuit 91 shown in FIG. 14 comprises an output circuit 17 shown in FIG. 2 and an output circuit 17 shown in FIG. 9. In the third embodiment, the ready/busy signal R/B, which is status data of a NAND chip, is transmitted to the NANDC from one input/output terminal IOx (IO7 in the case of FIG. 14) which varies from one NAND chip to another by a second status read command CMD_STS as in the first embodiment. Further, signal ST_C, which indicates that the status data of a NAND chip has changed, is transmitted to the RB terminal 62 of one NANDC via a wire 61 from the output terminal (RB7 in the case of FIG. 14) provided in each of the NAND chips (as described in the second embodiment).

FIG. 15 shows operation of the third embodiment, in which, for example, NANDC 0 accesses NAND chip CHP0 and CHP1.

In this example, the ready/busy signal R/B of NAND chip CHP0 is in the ready state (high level). Accordingly, signal ST_C, which indicates that the status data of NAND chip CHP0 has changed, is also at high level.

NANDC 0 issues the second status read command CMD_STS simultaneously to NAND chips CHP0 and CHP1 when signal ST_C of either one of NAND chips CHP0 and CHP1 becomes high level and the RB terminal 62 is asserted. NANDC 0 receives the ready/busy signal R/B from an I/O of each of NAND chips CHP0 and CHP1 in response to the second status read command CMD_STS.

The state of NAND chip CHP1 is already changed to the ready state before the second status read command CMD_STS is issued, but NANDC 0 is able to confirm based on the response to the second status read command CMD_STS that NAND chip CHP0 and CHP1 are both in the ready state (R). Therefore, NANDC 0 is able to issue clear command CMD_X0 to, for example, NAND chip CHP0, without having to issue the first status read command for each of NAND chip CHP0 and CHP1, and thus it is able to issue clear command CMD_X1 to NAND chip CHP1.

After that, NANDC 0 is able to issue read command CMD_R0 to NAND chip CHP0.

(Effect of Third Embodiment)

According to the third embodiment, an effect similar to those of the first and second embodiments can be obtained. Further, according to the third embodiment, NANDC 0 is able to determine the timing of issuing the second status read command CMD_STS when the RB terminal 62 is asserted. With this structure, clear commands CMD_X0 and CMD_X1 can be issued at appropriate times without having to issue the first status read command for each NAND chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory controller having n first data input/output terminals and a first input terminal, n being an integer having a value of two or more;
a first semiconductor chip having a first controller, a first output terminal, n second data input/output terminals, a first register for storing first status data of the first semiconductor chip, and a first output circuit connected to the first output terminal, each of the second data input/output terminals being connected to a respective one of the first data input/output terminals; and
a second semiconductor chip having a second controller, a second output terminal, n third data input/output terminals, a second register for storing second status data of the second semiconductor chip, and a second output circuit connected to the second output terminal, each of the third data input/output terminals being connected to a respective one of the first data input/output terminals shared with a respective one of the second data input/output terminals,
wherein
the first input terminal is connected to the first output terminal and the second output terminal,
the first output circuit is configured to generate first latch status data by latching changes in first status data stored in the first register of the first semiconductor chip by the first controller and provide the first latch status data at the first output terminal,
the second output circuit is configured to generate second latch status data by latching changes in second status data stored in the second register of the second semiconductor chip by the second controller and provide the second latch status data at the second output terminal, and
the memory controller is configured to output a status request signal via the first data input/output terminals to the first semiconductor chip or the second semiconductor chip, the first status data of the first semiconductor chip being output from a first terminal of the second data input/output terminals that is connected to a first terminal of the first data input/output terminals in response to the status request signal, and the second status data of the second semiconductor chip being output from a second terminal of the third data input/output terminals that is connected to a second terminal of the first data input/output terminals in response to the status request signal.

2. The system according to claim 1, wherein
the first status data of the first semiconductor chip includes ready/busy status data of the first semiconductor chip, and
the second status data of the second semiconductor chip includes ready/busy status data of the second semiconductor chip.

3. The system according to claim 1, wherein
the memory controller is configured to output the status request signal to both the first semiconductor chip and the second semiconductor chip simultaneously via the first data input/output terminals.

4. The system according to claim 1, further comprising:
a third semiconductor chip having a third output terminal and n fourth data input/output terminals, each of the fourth data input/output terminals being connected to a respective one of the first data input/output terminals; and
a fourth semiconductor chip having a fourth output terminal and n fifth data input/output terminals, each of the fifth data input/output terminals being connected to a respective one of the first data input/output terminals shared with a respective one of the fourth data input/output terminals,
wherein
the memory controller is further configured to output the status request signal via the first data input/output terminals to the third semiconductor chip or the fourth semiconductor chip, third status data of the third semiconductor chip being output, after the first status data of the first semiconductor chip is output from the first terminal of the second data input/output terminals that is connected to the first terminal of the first data input/output terminals, from a first terminal of the fourth data input/output terminals that is connected to the first terminal of the first data input/output terminals in response to the status request signal, and fourth status data of the fourth semiconductor chip being output, after the second status data of the second semiconductor chip is output from the second terminal of the third data input/output terminals that is connected to the second terminal of the first data input/output terminals, from a second terminal of the fifth data input/output terminals that is connected to the second terminal of the first data input/output terminals in response to the status request signal.

5. The system according to claim 1, wherein
the first semiconductor chip is further configured to output, simultaneously with the first status data of the first semiconductor chip that is output from the first terminal of the second data input/output terminals, third status data indicating a result of a programming operation therein at a third terminal of the second data input/output terminals that is connected to a third terminal of the first data input/output terminals, and the second semiconductor chip is further configured to output, simultaneously with the second status data of the second semiconductor chip that is output from the second terminal of the third data input/output terminals, fourth status data indicating a result of a programming operation therein at a fourth terminal of the third data input/output terminals that is connected to a fourth terminal of the first data input/output terminals.

6. The system according to claim 5, wherein
the third status data output from the third terminal of the second data input/output terminals indicates whether the programming operation in the first semiconductor chip passed or failed, and
the fourth status data output from the fourth terminal of the third data input/output terminals indicates whether the programming operation in the second semiconductor chip passed or failed.

7. The system according to claim 1, wherein
the first semiconductor chip includes a first selector connected to a first terminal of the second data input/output terminals, the first selector being configured to select, based on the status request signal, whether or not to output the first status data through the first terminal of the second data input/output terminals.

8. The system according to claim 1, wherein
the first output circuit includes a first holding circuit configured to latch changes in the first status data to generate the first latch status data, and a clear circuit configured to clear the first latch status data latched in the first holding circuit based on a first clear request.

9. The system according to claim 1, wherein
the first output circuit is further configured to selectively output one of the first latch status data and the first status data through the first output terminal.

10. The system according to claim 9, wherein
upon a start-up of the memory system, the first output circuit outputs the first status data through the first output terminal, and
after receiving a second request signal from the memory controller, the first output circuit outputs the first latch status data from the first output terminal.

11. The system according to claim 2, wherein
the first latch status data is asserted when the ready/busy status data of the first semiconductor chip is changed from a busy state to a ready state, and is kept asserted until a clear signal is input from the memory controller, and
the second latch status data is asserted when the ready/busy status data of the second semiconductor chip is changed from a busy state to a ready state, and is kept asserted until a clear signal is input from the memory controller.

12. The system according to claim 2, wherein
the first output terminal and the second output terminal are connected to the first input terminal via a logical OR circuit.

13. The system according to claim 12, wherein
when a signal input to the first input terminal indicates that at least one of the first latch status data and the second latch status data is asserted, the memory controller outputs the status request signal to the first and second semiconductor chips, and
when the ready/busy status data of one of the first and second semiconductor chips indicates a ready status, the memory controller outputs a clear signal to clear the first latch status data or the second latch status data corresponding to said one of the first and second semiconductor chips prior to issuing a command thereto.

* * * * *